United States Patent

Hayashi et al.

[11] Patent Number: 5,889,640
[45] Date of Patent: *Mar. 30, 1999

[54] MAGNETORESISTIVE ELEMENT AND SENSOR HAVING OPTIMAL CROSS POINT

[75] Inventors: Kazuhiko Hayashi; Junichi Fujikata; Hidefumi Yamamoto; Kunihiko Ishihara; Masafumi Nakada, all of Tokyo, Japan

[73] Assignee: NEC Corporation, Japan

[*] Notice: This patent issued on a continued prosecution application filed under 37 CFR 1.53(d), and is subject to the twenty year patent term provisions of 35 U.S.C. 154(a)(2).

[21] Appl. No.: 711,909
[22] Filed: Sep. 12, 1996

[30] Foreign Application Priority Data

Sep. 14, 1995 [JP] Japan .................. 7-236470

[51] Int. Cl.⁶ ........................................ G11B 5/39
[52] U.S. Cl. ............................................ 360/113
[58] Field of Search ...................... 360/113, 126; 338/32 R; 324/252

[56] References Cited

U.S. PATENT DOCUMENTS

| | | | |
|---|---|---|---|
| 4,949,039 | 8/1990 | Grunberg | 324/252 |
| 5,287,238 | 2/1994 | Baumgart et al. | 360/113 |
| 5,301,079 | 4/1994 | Cain et al. | 360/113 |
| 5,432,734 | 7/1995 | Kawano et al. | 360/113 |
| 5,549,978 | 8/1996 | Iwasaki et al. | 360/113 |
| 5,563,752 | 10/1996 | Komuro et al. | 360/113 |
| 5,576,915 | 11/1996 | Akiyama et al. | 360/113 |
| 5,583,725 | 12/1996 | Coffey et al. | 360/113 |
| 5,585,199 | 12/1996 | Kamiguchi et al. | 428/621 |
| 5,591,532 | 1/1997 | Berkowitz | 428/611 |
| 5,654,854 | 8/1997 | Mallary | 360/113 |
| 5,766,743 | 6/1998 | Fujikata et al. | 428/212 |

FOREIGN PATENT DOCUMENTS

| | | |
|---|---|---|
| 674327 A1 | 9/1995 | European Pat. Off. . |
| 4-358310 | 12/1992 | Japan . |
| 6-203340 | 7/1994 | Japan . |
| 8-204253 | 8/1996 | Japan . |

OTHER PUBLICATIONS

"Thin Film Magnetoresistors in Memory, Storage, and Related Applications" Thompson et al IEEE Transactions on Magnetics, vol. MAG–11; No. 4; Jul. 1975 pp. 1039–1050.

Primary Examiner—Jefferson Evans
Attorney, Agent, or Firm—Hayes, Soloway, Hennessey, Grossman & Hage, P.C.

[57] ABSTRACT

A magnetoresistive element generally includes consecutively an antiferromagnetic layer, a first ferromagnetic layer, a non-mangetic layer, and a second ferromagnetic layer. Instead of the non-magnetic layer, the magnetoresistive element may include a combination of a Co layer, a non-magnetic layer, and a Co layer. The antiferromagnetic layer is made of nickel oxide, a mixture of nickel oxide and cobalt oxide, or a laminate of nickel oxide and cobalt oxide. The ferromagnetic layer has a thickness of 1 to 10 nm, and the element has a height of 0.1 to 1 um. The non-magnetic layer has a thickness of 2 to 3 nm, and the antiferromagnetic layer has a thickness of 5 to 30 nm. The magnetoresistive element has an appropriate cross point, outputs an excellent reproduced signal, and has a desirable half-width with respect to the output signal.

12 Claims, 8 Drawing Sheets

MAGNETORESISTIVE ELEMENT AND SENSOR HAVING OPTIMAL CROSS POINT

BACKGROUND OF THE INVENTION (a) Field of the Invention

The present invention relates to a magnetoresistive element, and to a magnetoresistive sensor using such an element.

(b) Description of the Related Art

A so called magnetoresistive (MR) sensor or MR head has been known in the form of magnetic read sensor, which can read out data from a magnetic layer at a large linear density. The electric resistance of an MR sensor varies as a function of the strength and direction of magnetic fluxes sensed by a read element, whereby a magnetic field signal corresponding to the resistance is output from the MR sensor. In such a conventional MR sensor, the read element operates based on the anisotropic magnetoresistance (AMR) effect in which the resistance of the read element varies in proportion to the square of the cosine of the angle between the magnetization and the direction of sense current flowing through the element. The AMR effect is described in detail in "Memory, Storage, and Related Applications," by D. A. Thompson, et al., IEEE Trans. Mag. MAG-11, p. 1039 (1975).

Another paper has reported a more remarkable magnetoresistance effect in which the resistance of a layered magnetic sensor varies due to both spin-depending transfer of conduction electrons between magnetic layers via a non-magnetic layer, and spin-depending scattering at the interfaces between the layers accompanying the transfer of conduction electrons. This magnetoresistance effect is variously referred to as "giant magnetoresistance effect" or "spin valve (SV) effect." Such an MR sensor fabricated of the appropriate materials provides improved sensitivity and greater change in resistance than observed in sensors utilizing the AMR effect. In this type of MR sensor, the in-plane resistance between a pair of ferromagnetic layers, separated by a non-magnetic layer, varies in proportion to the cosine of the angle between the magnetization in the two ferromagnetic layers.

Patent Publication No. JP-A-90-61572 (corresponding to U.S. Pat. No. 4,949,039) discloses a layered magnetic structure which yields enhanced MR effect caused by antiparallel alignment of the magnetizations in the magnetic layers. In this patent publication, ferromagnetic transition metals and alloys are listed as possible materials for use in the layered structure. The patent publication also discloses a structure having an antiferromagnetic layer added to at least one of two ferromagnetic layers separated by an intermediate layer, as well as suitability of FeMn for use as the antiferromagnetic layer.

Patent Publication No. JP-A-92-358310 (priority claimed from a U.S. application filed on Dec. 11, 1990) discloses an MR sensor having two thin layers of a ferromagnetic material separated by a thin film layer of a non-magnetic metallic material. When no magnetic field is applied to the sensor, the magnetizations of the two ferromagnetic thin film layers intersect each other substantially at right angles. When a magnetic field is applied to the sensor, the resistance between the two magnetic layers varies in proportion to the cosine of the angle between the magnetizations of the two ferromagnetic layers, independent of the direction of the current flowing through the sensor.

Patent Publication No. JP-A-94-203340 (corresponding to U.S. Pat. No. 5,301,079) discloses an MR sensor which has two thin film layers of a ferromagnetic material separated by a thin film layer of a non-magnetic metallic material and which operates based on the effect similar to that of the sensor disclosed in the above patent publication. However, in this MR sensor, when no magnetic field is applied to the sensor, the direction of magnetization in an adjacent antiferromagnetic layer adjacent to one of the two ferromagnetic thin film layers is maintained perpendicular to the others of ferromagnetic layers.

When a magnetoresistive element utilizing the SV effect is used as a magnetoresistive sensor, it is necessary to optimize the operational point (or cross point) for zero applied magnetic field, as in conventional magnetoresistive sensors utilizing the AMR effect. In the magnetoresistive element utilizing the SV effect, the shape of the element affects a playback output from a head. Moreover, in an SV element utilizing a non-conductive material as an antiferromagnetic material, the thickness of the antiferromagnetic material affects the gap length of a shielded magnetoresistive element, and also affects the waveform of a signal reproduced by the shielded magnetoresistive head.

SUMMARY OF THE INVENTION

In view of the foregoing, it is an object of the present invention to provide a magnetoresistive element in which the thickness of a ferromagnetic layer, the element height, and the thickness of an antiferromagnetic layer are determined so as to fall within preferable ranges, thereby providing a desirable cross point, playback output and a half-width with respect to the output signal.

In accordance with a first aspect of the present invention, there is provided a magnetoresistive element comprising consecutively an antiferromagnetic layer, a first ferromagnetic layer, a non-magnetic layer and a second ferromagnetic layer of a soft magnetic material, said antiferromagnetic layer having a thickness of 5 to 30 nanometers and being made of one of nickel oxide, a mixture of nickel oxide and cobalt oxide and a laminate including a nickel oxide film and a cobalt oxide film, said first and second ferromagnetic layers having a thickness of 1 to 10 nanometers.

In accordance with a second aspect of the present invention, there is provided a magnetoresistive sensor comprising a substrate; a lower shield layer and a lower gap layer consecutively formed on said substrate and having a pattern, an active layer formed on said lower gap layer and including a magnetoresistive element and a longitudinal bias layer formed on an edge of said magnetoresistive element for providing a bias magnetic field to said magnetoresistive element; and an upper gap layer and an upper shield layer consecutively formed on said active layer, said magnetoresistive element including an antiferromagnetic layer, a first ferromagnetic layer of a hard magnetic material, a non-magnetic layer and a second ferromagnetic layer of a soft magnetci material consecutively formed on said lower gap layer, said antiferromagnetic layer having a thickness of 5 to 30 nanometers and being made of one of nickel oxide, a mixture of nickel oxide and cobalt oxide and a laminate including a nickel oxide film and a cobalt oxide film, said first and second ferromagnetic layers having a thickness of 1 to 10 nanometers.

With the present invention, a magnetoresistive element is provided which has a desirable cross point, outputs an appropriate reproduced signal and has a desirable half-width with respect to the output signal.

DESCRIPTION OF THE PREFERRED EMBODIMENTS

The present invention provides magnetoresistive element and sensor, the magnetoresistive element comprising an antiferromagnetic layer, a first ferromagnetic layer, a non-magnetic layer, and a second ferromagnetic layer, the magnetoresistive element comprising an antiferromagnetic layer, a first ferromagnetic layer of a hard magnetic material, a Co layer, a non-magnetic layer, a Co layer, and a second ferromagnetic layer. In the magnetoresistive element or sensor, the second ferromagnetic layer is made of a soft magnetic material, and the first and second magnetic layers are magnetostatically coupled with each other at their film end portions though non-magnetic material or space. Since the magnetization within the first ferromagnetic layer is fixed by the antiferromagnetic layer, the magnetostatic coupling produces only a force such that the second ferromagentic layer is magnetized in the direction opposite to that of the first ferromagnetic layer. Accordingly, as the degree of the magnetostatic coupling increases, the angles between the directions of magnetization in the two ferromagnetic layers increase because of the rotation of both the magnetizations moving in opposite directions.

Figure 9:
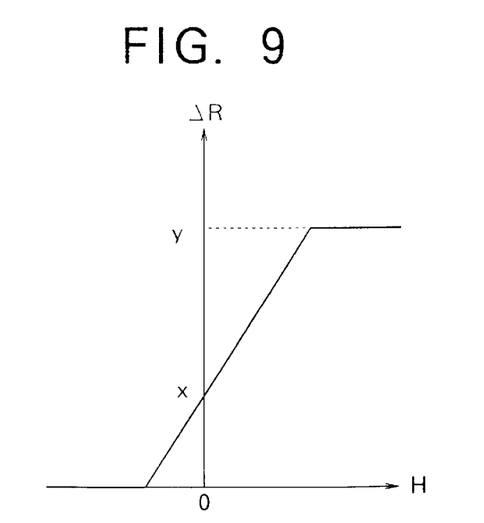
FIG. 9 is a graph showing the definition of the cross point.

In order to detect positive and negative magnetic fields equally, the cross point of the sensor must be set properly. As shown in FIG. 9, the cross point value CP indicating point for the zero applied field is calculated as follows:

$$CP = 1 - (x/y),$$

wherein x is a variation of the resistance of the sensor when the applied magnetic field is zero, and y is a variation of the resistance of the sensor when the variation of the resistance is saturated.

Accordingly, in order to detect positive and negative magnetic fields equally, the cross point value CP should be set at 0.5 (optimal value). To set the cross point value CP at 0.5, the magnetization of the second ferromagnetic layer should be perpendicular to the magnetization of the first ferromagnetic layer. Therefore, the degree of the magnetostatic coupling must be set at an appropriate value so as to obtain the state as described above. Since the magnitude of the magnetostatic coupling between the ferromagnetic layers can be varied by changing the thickness of both the ferromagnetic layers, the cross point value CP can be made close to 0.5 by appropriately determining the thickness of the ferromagnetic layers. However, it is to be noted that the magnetostatic coupling between the two ferromagnetic layers also varies depending on the distance between the one of the magnetoresistive layers and a shield layer, because the variation in the distance between the one of the magnetoresistive layers and the shield layer affects the magnetic flux at the end portions of the other of the ferromagnetic layers.

In the magnetoresistive element having the structure as described above, when the element height decreases, the resistance of the element increases, as does the ratio of an area inside the sensor in which the magnetization is reversed properly in accordance with variation in the external magnetic field. Therefore, the amount of variation in the resistance increases as the element height decreases.

Since the antiferromagnetic layer may be fabricated of an insulating material in the magnetoresistive element having the structure as described above, the thickness of the antiferromagnetic layer contributes to increasing the inter-shield gap of a head manufactured using the magnetoresistive sensor. That is, the inter-shield gap is increased by an amount corresponding to the thickness of the antiferromagnetic layer. Since the area from which magnetic fluxes can be detected is increased as the thickness of the antiferromagnetic layer increases, the half-width with respect to the output signal increases. Therefore, the half-width can be improved by decreasing the thickness of the antiferromagnetic layer.

Figure 1:
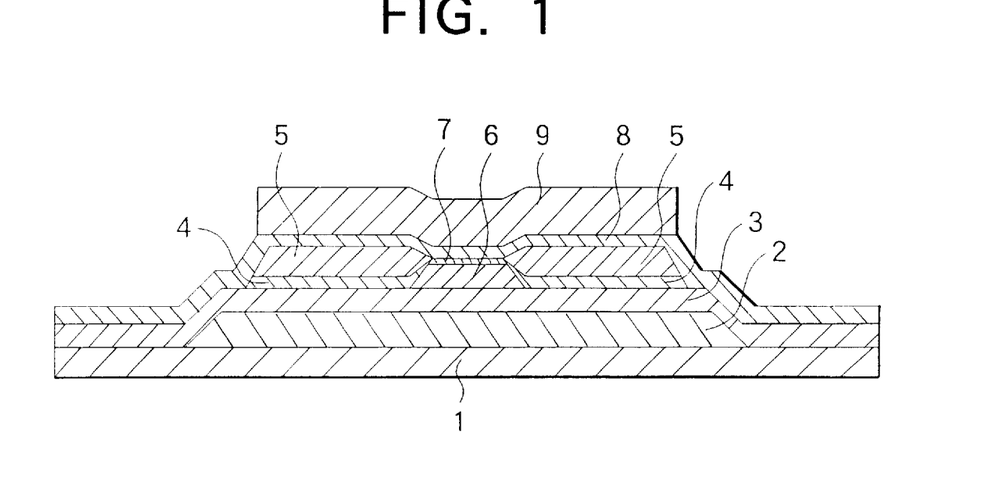
FIG. 1 is a cross sectional view of a typical MR sensor applicable to the present invention.
Figure 2:
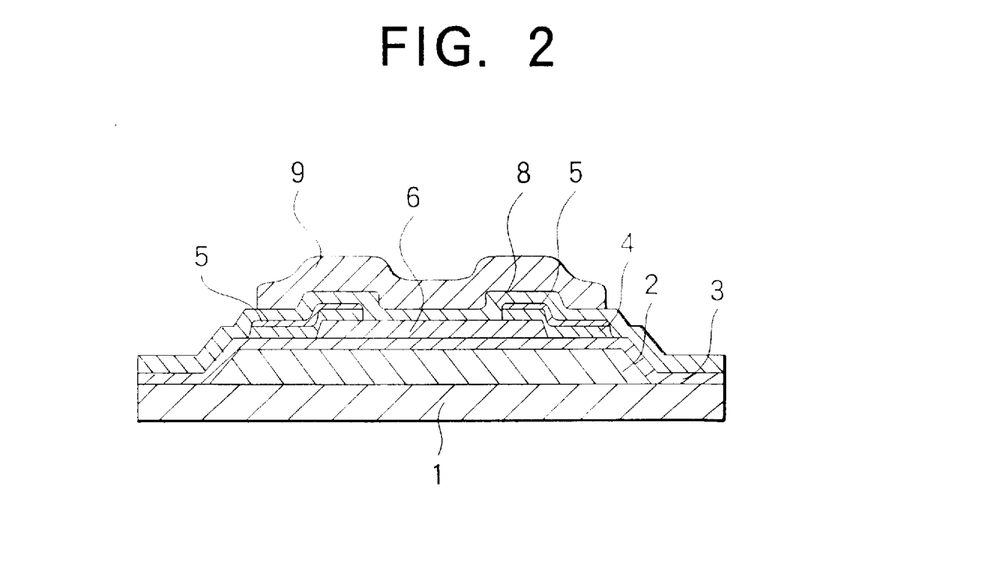
FIG. 2 is a cross sectional view of another typical MR sensor applicable to the present invention.

The shielded-type sensor to which the present invention is applied may have a structure shown in FIG. 1 or FIG. 2.

In the shielded sensor shown in FIG. 1, a lower shield layer 2 and an active layer constituting a magnetoresistive element 6 are laminated on a substrate 1. A gap-defining insulating layer 7 may be further layered on the magnetoresistive element 6 in some cases. Through use of a photoresistive pattering process, the shield layer 2 is often patterned into an appropriate pattern having a predetermined size. Similarly, through use of a photoresistive pattering process, the magnetoresistive element 6 is also patterned into an appropriate pattern having a predetermined size. A longitudinal bias layer 4 and a lower electrode layer 5 are successively layered such that these layers 4 and 5 contact the end portions of the magnetoresistive element 6. Above these layers 4 and 5 are subsequently layered an upper gap layer 8 and an upper shield layer 9.

In the shielded sensor shown in FIG. 2, a lower shield layer 2 and a magnetoresistive element 6 are laminated on a substrate 1. Through use of a photoresistive pattering process, the shield layer 2 is often patterned into an appropriate pattern having a proper size. Similarly, through use of a photoresistive pattering process, the magnetoresistive element 6 is also patterned similarly. A longitudinal bias layer 4 and a lower electrode layer 5 are successively layered such that these layers 4 and 5 partially overlap the magnetoresistive element 6. Above these layers 4 and 5 are subsequently layered an upper gap layer 8 and an upper shield layer 9.

In both the sensors shown in FIG. 1 and FIG. 2, the lower shield layer 2 may be made of NiFe, CoZr alloy, FeAlSi, iron nitride based material, or a like material, and may have a thickness in the range of 0.5 to 10 μm. The lower gap layer 3 may be made of aluminum oxide, silicon oxide, aluminum nitride, silicon nitride, or a like material, and preferably has a thickness in the range of 0.03 to 0.20 um. The lower electrode layer 4 is preferably made of Zr, Ta, Mo, o r an alloy or mixture of these materials, and preferably has a thickness in the range of 0.01 to 0.10 μm. The longitudinal bias layer 4 may be made of CoCrPt, CoCr, CoPt, CoCrTa, FeMn, NiMn, Nio, NiCoO, or a like material. The gap-defining insulating layer 7 may be made of aluminum oxide, silicon oxide, aluminum nitride, silicon nitride, or a like material, and preferably has a thickness in the range of 0.005 to 0.05 μm. The upper gap layer 8 may be made of aluminum oxide, silicon oxide, aluminum nitride, silicon nitride, or a like material, and preferably has a thickness in the range of 0.03 to 0.20 μm.

Figure 3:
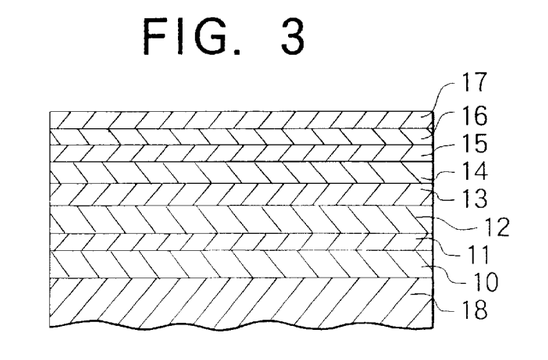
FIG. 3 is a cross sectional view of a typical magnetoresistive element applicable to the present invention.
Figure 4:
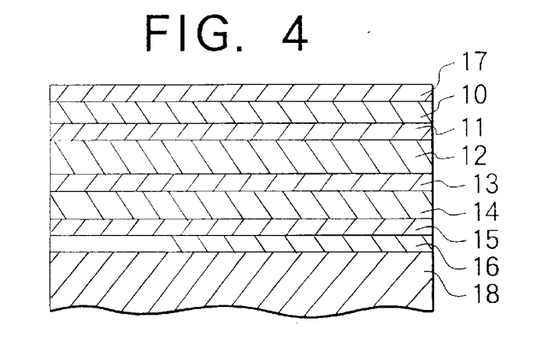
FIG. 4 is a cross sectional view of another typical magnetoresistive element applicable to the present invention.

Referring to FIGS. 3 and 4, a description will be given of the layer structure of a magnetoresistive element provided by the present invention. The element shown in FIG. 3 has a layer structure in which a first antiferromagnetic layer 10 made of nickel oxide, a second antiferromagnetic layer 11 made of cobalt oxide, a first ferromagnetic layer 12, a first MR enhancement layer 13, a non-magnet layer 14, a second MR enhancement layer 15, a second ferromagnetic layer 16, and a protective layer 17 are successively laminated on a base layer 18. The element shown in FIG. 4 has a layer structure in which a second ferromagnetic layer 16, a second MR enhancement layer 15, a non-magnetic layer 14, a first MR enhancement layer 13, a first ferromagnetic layer 12, a cobalt oxide layer 11, a nickel oxide layer 10, and a protective layer 17 are successively laminated on a base layer 18. It is to be noted in this example, the "first" and "second" are reversed in the order of occurrence for a convenience of the following description.

In those elements shown in FIGS. 3 and 4, the first ferromagnetic layer 12 may be made of NiFe, NiFeCo, CoZr alloy, FeCoB, Sendust, iron nitride material, FeCo, or a like material, and preferably has a thickness in the range of 1 to 10 nm. The first MR enhancement layer 13 may be made of Co, NiFeCo, FeCo, or a like material, and preferably has a thickness in the range of 0.5 to 2 nm. If the first MR enhancement layer is not provided for saving the manufacturing step, the MR ratio decreases slightly compared to the case of providing the first MR enhancement layer. The non-magnetic layer 14 may be made of Cu, a Cu alloy containing 1 to 20 at % of Ag, or a Cu alloy containing 1 to 20 at % of Re, and preferably has a thickness in the range of 2 to 3 nm.

The second MR enhancement layer 15 may be made of Co, NiFeCo, FeCo, or a like material, and preferably has a thickness in the range of 0.5 to 2 nm. If the second MR enhancement layer is not provided for saving the manufacturing step, the MR ratio decreases slightly compared to the case of providing the second MR enhancement layer. The second ferromagnetic layer 16 may be made of NiFe, NiFeCo, CoZr based alloy, FeCoB, Sendust, iron nitride based material, FeCo, or a like material, and preferably has a thickness in the range of 1 to 10 nm. When the first or second magnetic layer is made of a material including NiFe or NiFeCo as a base material or a main component thereof, the base layer should be made of Ta, Hf, Zr, or the like, which has an fcc crystal structure. This improves the crystallinity of each of the first or second ferromagnetic layer and the non-magentic layer, thereby improving the MR ratio.

The protective layer may be made of an oxide or nitride of a material selected from a the group consisting of Al, Si, Ta and Ti, or a material selected from the group consisting of Cu, Au, Ag, Ta, Hf, Zr, Ir, Si, Pt, Ti, Cr, Al and C, or a mixture of these materials. If the protective layer is not provided for saving the manufacturing step to improve the productivity, the resistance to corrosion slightly decreases.

EMBODIMENTS

Embodiments 1–12

Various magnetoresistive elements were manufactured as samples each of which had a structure in which an aluminum base layer, a 30 nm-thick nickel oxide layer, a 0.9 nm-thick Co layer, a 4 nm-thick first ferromagnetic layer, a 2.5 nm-thick Cu layer, a 6 nm-thick second ferromagnetic layer, and a 1.5 nm-thick Ta protective layer were laminated in this order. These magnetoresistive elements were manufactured while selecting the materials for the first and second ferromagnetic layers. The MR ratio of each element is shown in Table 1.

TABLE 1

| Embodiment | First ferromagnetic layer | Second ferromagnetic layer | MR ratio (%) |
|---|---|---|---|
| 1 | NiFe | NiFe | 6 |
| 2 | NiFeCo | NiFe | 7 |
| 3 | Co | NiFe | 8 |
| 4 | FeCo | NiFe | 8 |
| 5 | NiFe | NiFeCo | 8 |
| 6 | NiFeCo | NiFeCo | 10 |
| 7 | Co | NiFeCo | 11 |
| 8 | FeCo | NiFeCo | 11 |
| 9 | NiFe | FeCo | 8 |
| 10 | NiFeCo | FeCo | 9 |
| 11 | Co | FeCo | 12 |
| 12 | FeCo | FeCo | 13 |

Embodiment 13

A magnetoresistive element was manufactured as a sample which had a structure in which an aluminum base layer, a 30 nm-thick nickel oxide layer, a 0.9 nm-thick cobalt layer, a 4 nm-thick NiFe layer, a 1 nm-thick Co layer, a 2.5 nm-thick Cu layer, a 1 nm-thick Co layer, a 6 nm-thick NiFe layer, and a 1.5 nm-thick Ta protective layer were laminated in this order. The MR ratio of the element was 0.9%.

Figure 5:
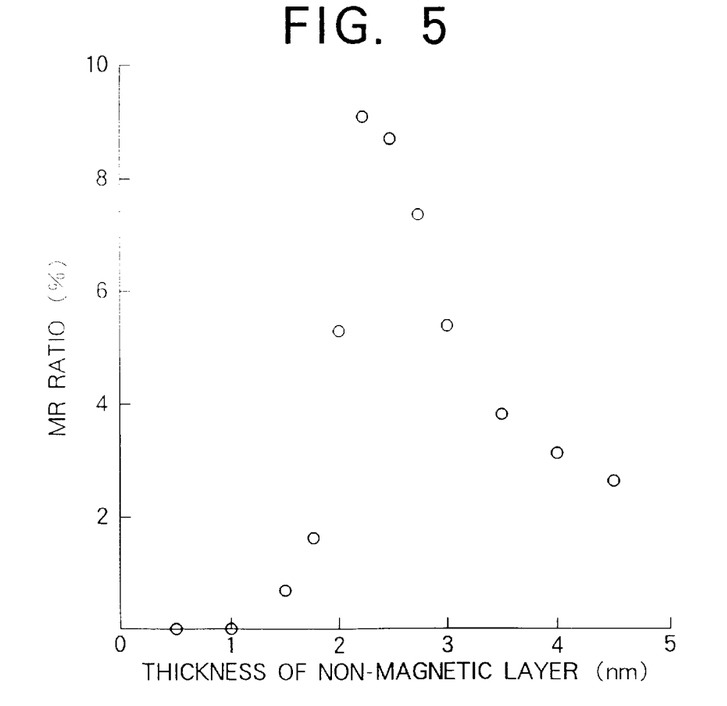
FIG. 5 is a graph showing the relationship between the thickness of the non-magnetic layer in FIGS. 1 to 4 and the MR ratio.

Various magnetoresistive elements were manufactured as samples each of which had a structure in which an aluminum base layer, a 30 nm-thick nickel oxide layer, a 0.9 nm-thick Co layer, a 4 nm-thick NiFe layer, a 1 nm-thick Co layer, a Cu layer, a 1 nm-thick Co layer, a 6 nm-thick NiFe layer, and a 1.5 nm-thick Ta protective layer were laminated in this order. These magnetoresistive elements were manufactured, while selecting the thickness of the Cu layer (non-magnetic layer). The MR ratios of these magnetoresistive elements were measured. The test result is shown in FIG. 5. When the thickness of the non-magnetic layer was in the range of 2 to 3 nm, the MR ratio exCeeded 5%. From this test result, it is found that the range of 2 to 3 nm is an appropriate range for the thickness of the non-magnetic layer.

Subsequently, various magnetoresistive elements were manufactured as samples each of which had a structure in which an aluminum base layer, a 30 nm-thick nickel oxide layer, a 0.9 nm-thick Co layer, a 4 nm-thick NiFe layer, a 1 nm-thick Co layer, a 2.5 nm-thick Cu layer, a 1 nm-thick Co layer, a 6 nm-thick NiFe layer, and a 1.5 nm-thick Ta protective layer were laminated in this order. These magnetoresistive elements were manufactured, while selecting the amount of Ag added to the Cu layer. For each element, heat treatment was performed over 1 hour at different temperatures, and a heat treatment temperature T was selected at which the MR ratio decreased down to 50% of that measured before the heat treatment. The heat treatment temperature T monotonically increased as the amount of Ag increased, as shown in Table 2.

TABLE 2

| Amount of Ag added to Cu layer (at %) | Heat treatment temperature at which MR ratio decreased to 50% after 1-hour heat treatment (°C.) |
|---|---|
| 0 | 220 |
| 2 | 230 |
| 3 | 240 |
| 5 | 250 |
| 7 | 260 |
| 10 | 270 |
| 15 | 275 |
| 20 | 275 |
| 30 | 280 |
| 40 | 280 |
| 50 | 280 |

Subsequently, various magnetoresistive elements were manufactured as samples each of which had a structure in which an aluminum base layer, a 30 nm-thick nickel oxide layer, a 0.9 nm-thick Co layer, a 4 nm-thick NiFe layer, a 1 nm-thick Co layer, a 2.5 nm-thick Cu layer, a 1 nm-thick Co layer, a 6 nm-thick NiFe layer, and a 1.5 nm-thick Ta protective layer were laminated in this order. These magnetoresistive elements were manufactured, while selecting the amount of Re added to the Cu layer. For each element, heat treatment was performed over 1 hour at different temperatures, and a heat treatment temperature T was selected at which the MR ratio decreased down to 50% of that measured before the heat treatment. The heat treatment temperature T monotically increased as the amount of Re increased, as shown in Table 3.

TABLE 3

| Amount of Re added to Cu layer (at %) | Heat treatment temperature at which MR ratio decreased to 50% after 1-hour heat treatment (°C.) |
|---|---|
| 0 | 220 |
| 2 | 225 |
| 3 | 235 |
| 5 | 250 |
| 7 | 260 |
| 10 | 270 |
| 15 | 270 |
| 20 | 275 |
| 30 | 280 |
| 40 | 280 |
| 50 | 280 |

Figure 6:
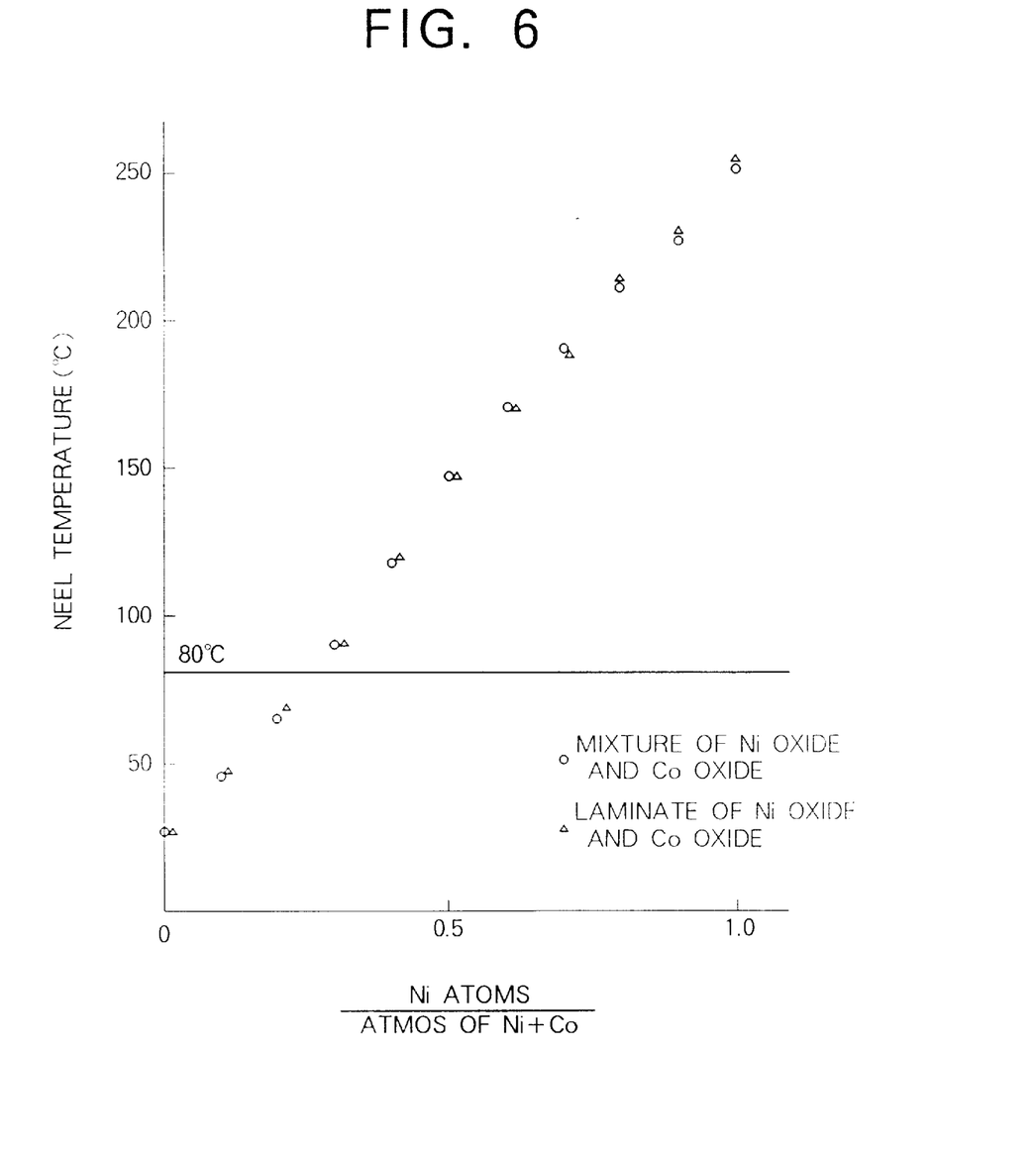
FIG. 6 is a graph showing the relationship between the Neel temperature and the ratio of the number of Ni atoms to the total number of Ni atoms and Co atoms in the antiferromagnetic layer in FIGS. 3 and 4.

Subsequently, various magnetoresistive elements were manufactured as samples each of which had a structure in which an aluminum base layer, a antiferromagnetic layer including a 30 nm-thick NiCo oxide layer or NiO/CoO supper lattice layer, a 4 nm-thick first ferromagnetic layer, a 2.5 nm-thick Cu layer, a 6 nm-thick second ferromagnetic layer, and a 1.5 nm-thick Ta protective layer were laminated in this order. These magnetoresistive elements were manufactured, while selecting the ratio of the number of Ni atoms in the NiCoO layer, or in a Nio/CoO supper lattice layer, the ratio of the number of Ni atoms to the total number of Ni atoms and Co atoms in that layer. Each element was heated so as to measure the Neel temperature of the antiferromagnetic layer based on the temperature at which variation of the resistance became zero (see FIG. 6). The Neel temperature increased linearly as the ratio of the number of Ni atoms to the number of Ni atoms and Co atoms increased. Since the maximum operational temperature of the magnetoresistive sensor is generally about 80° C., it is considered that the ratio of the number of Ni atoms to the number of Ni atoms and Co atoms should be equal to or greater than 0.25.

Embodiment 14

A shielded magnetoresistive sensor was manufactured as follows. A 2 nm-thick NiFe layer was formed in a predetermined pattern as a lower shield layer 2, and an alumina layer having a thickness between 0.07 and 0.15 nm was laminated as a lower gap layer. Subsequently, a magnetoresistive element 6 having the structure shown in FIG. 3 was formed. Specifically a 23 nm-thick nickel oxide layer, a 1 nm-thick cobalt oxide layer, a 2 to 20 nm-thick NiFe layer, a 1 nm-thick Co layer, a 1 to 4 nm-thick Cu layer, a 1 nm-thick Co layer, and a 2 to 20 nm-thick NiFe layer were laminated in this order on the lower gap layer 3. Each of these layers was patterned in an appropriate pattern. A 0.025 nm-thick longitudinal bias layer made of CoCrPt was formed such that it contacted the end portions of the magnetoresistive element 6, and a 0.05 nm-thick lower electrode made of Mo was formed thereon. The gap-defining insulating layer 7 was made of alumina and had a thickness of 0.01 nm. The upper gap layer 8 was made of alumina, and had a thickness of 0.07 to 0.15 nm. The upper shield layer 9 was made of NiFe, and had a thickness of 2 nm.

Figure 7:
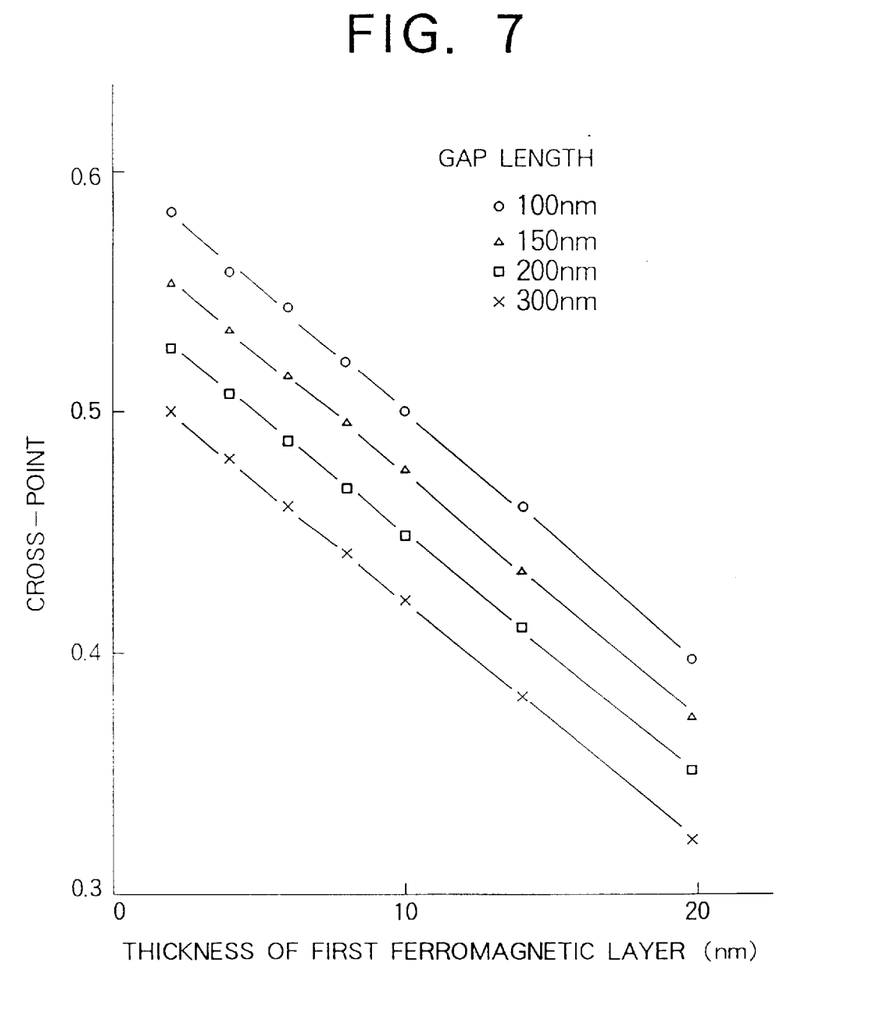
FIG. 7 is a graph showing the relationship between the thickness of a first ferromagnetic layer in FIGS. 3 and 4 and the cross point value when the gap length is changed.
Figure 8:
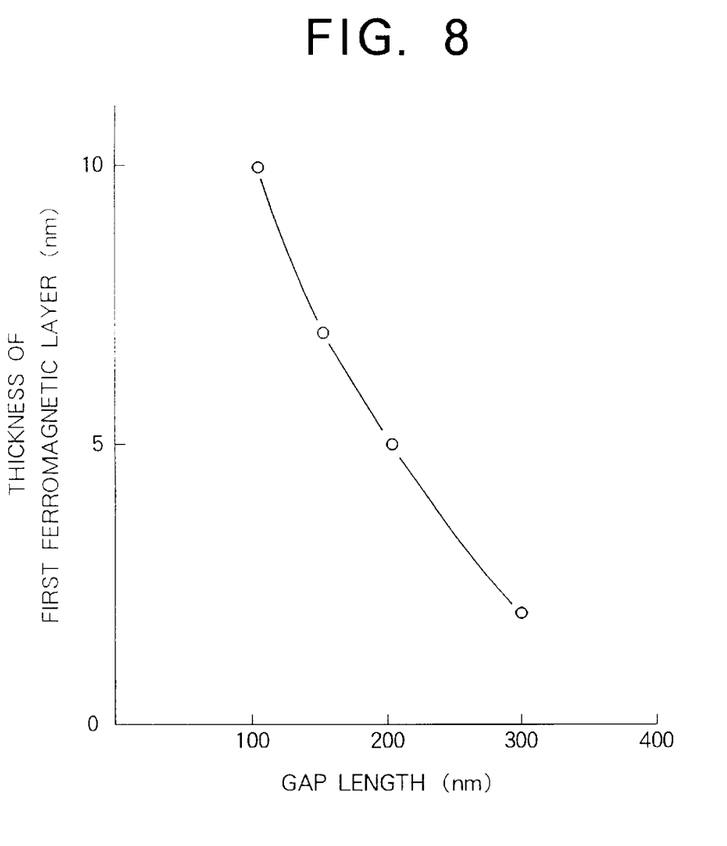
FIG. 8 is a graph showing the relationship between the gap length and the thickness of the first ferromagnetic layer which makes the cross point value 0.5.

FIG. 7 shows the relationship between the thickness of the first ferromagnetic layer and the cross point when the gap length is changed. FIG. 8 shows the relationship between the gap length and the thickness of the first ferromagnetic layer which makes the cross point value 0.5. The thickness of the second ferromagnetic layer was fixed at 6 nm. The definition of the cross point is shown in FIG. 9.

The cross point value CP decreased as the thickness of the first ferromagnetic layer increased. The thickness of the first ferromagnetic layer which brings the cross point value CP into the range between 0.45 and 0.55 decreases linearly as the thicknesses of the upper gap layer and the lower gap layer increase. When the gap length defined by the thickness of both the gap layers falls in the range shown in the graph of FIG. 8, the thickness of the first ferromagnetic layer which makes the cross point value 0.5 falls in the range of 1 to 10 nm.

Figure 10:
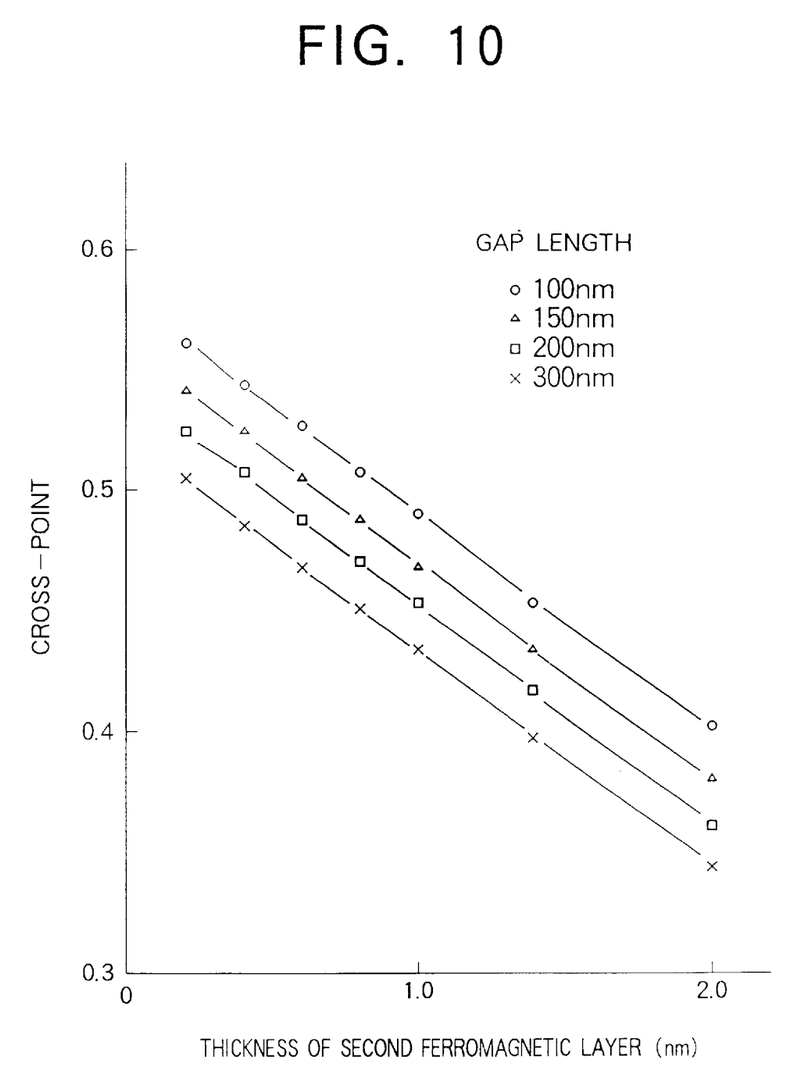
FIG. 10 is a graph showing the relationship between the thickness of a second ferromagnetic layer in FIG. 3 or 4 and the cross point when the gap length is changed.
Figure 11:
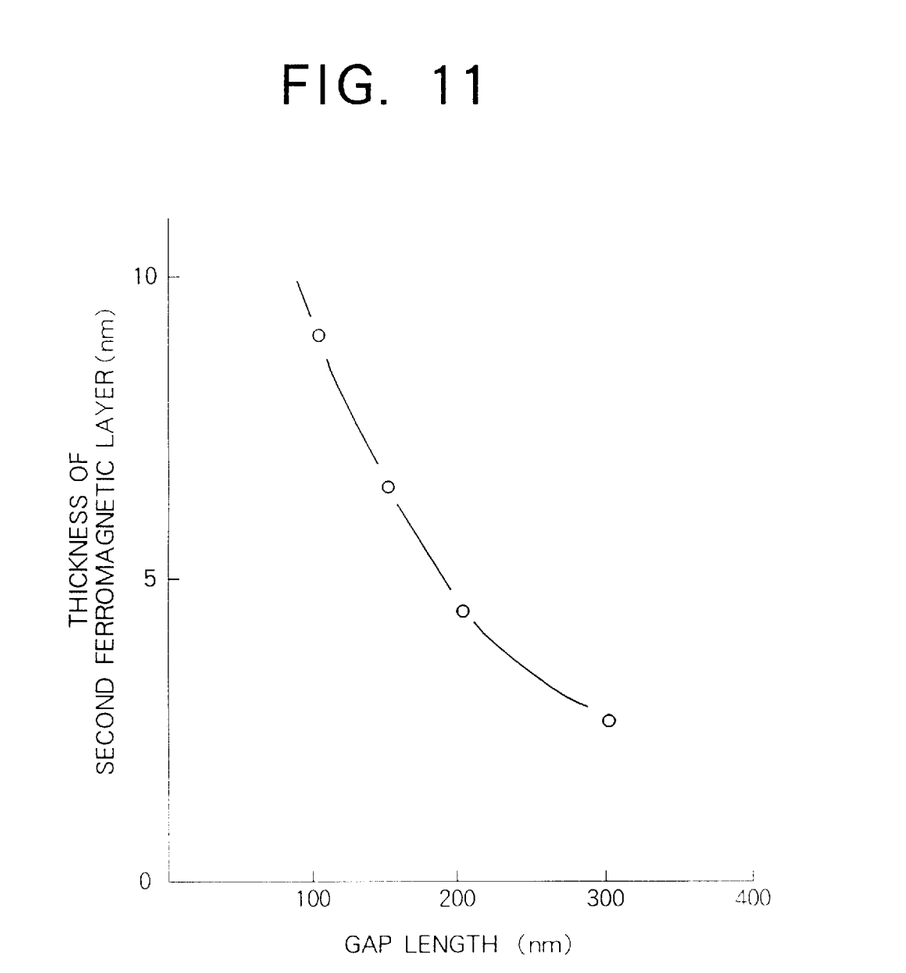
FIG. 11 is a graph showing the relationship between the gap length and the thickness of the second ferromagnetic layer in FIG. 3 or 4 which makes the cross point value 0.5.

FIG. 10 shows the relationship between the thickness of the second ferromagnetic layer and the cross point while the gap length is changed. FIG. 11 shows the relationship between the gap length and the thickness of the second ferromagnetic layer which brings the cross point value into the range of 0.45 to 0.55.

The thickness of the upper gap layer was selected to be identical with that of the lower gap layer, and the thickness of the first ferromagnetic layer was 6 nm. See the definition of the cross point from FIG. 9.

The cross point value decreased as the thickness of the second ferromagnetic layer increased. The thickness of the second ferromagnetic layer which brings the cross point value into the range of 0.45 to 0.55 decreases linearly as the thicknesses of the upper gap layer and the lower gap layer increase. When the gap length falls in the range shown in the graph of FIG. 11, the thickness of the first ferromagnetic layer which brings the cross point value into the range of 0.45 to 0.55 falls in the range of 1 to 10 nm.

Table 4 shows half-width with respect to the output signal while the thickness of the first ferromagnetic layer is varied in the range of 10 to 100 nm. The linear speed of a medium during recording and playback operations is 10 m/s. In order to realize a high recording density equal to or higher than 2 Gb/in$^2$, the half-width with respect to the output signal should be equal to or less than 25 ns. This requirement was satisfied when the thickness of the antiferromagnetic layer was in the range of 5 to 30 nm.

TABLE 4

| Thickness of antiferromagnetic layer (nm) | Half-width with respect to output signal (ns) |
| --- | --- |
| 5 | 12 |
| 10 | 15 |
| 20 | 20 |
| 30 | 25 |
| 50 | 30 |
| 100 | 50 |

Figure 12:
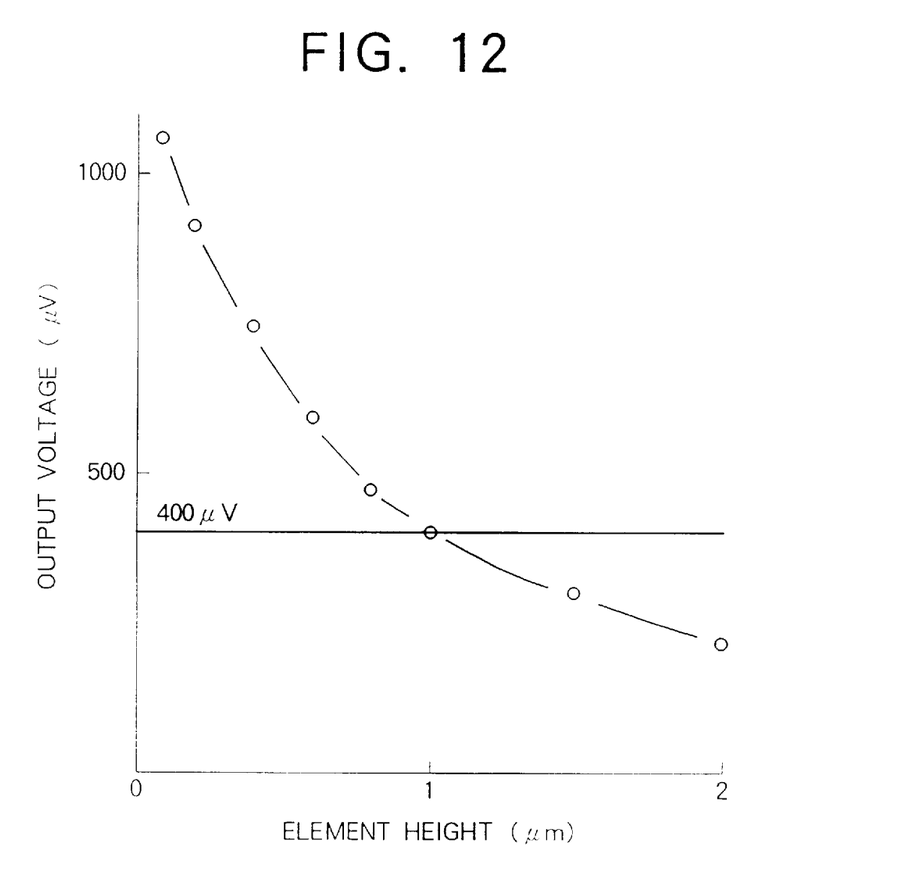
FIG. 12 is a graph showing the relationship between the element height and the output voltage of the sensor shown in FIGS. 1 and 2.

FIG. 12 shows the relationship between the element height and the output voltage of the sensor. The sensing current was 2×107 A/cm$^2$, and the track width was 1 um. As the element height decreased, the output voltage increased. It is generally considered that the magnitude of the output voltage should be equal to or higher than about 400 μV. From FIG. 12, it is found that the above requirement was satisfied when the element height fell in the range of 0.1 to 1 μm.

What is claimed is:

1. A magnetoresistive element comprising an antiferromagnetic layer, a first ferromagnetic layer, a non-magnetic layer and a second ferromagnetic layer of a soft magnetic material, said antiferromagnetic layer having a thickness of 5 to 30 nanometers and being made of a laminate inducing an nickel oxide film and a cobalt oxide film, said first and second ferromagnetic layers having a thickness of 1 to 10 nanometers.

2. A magnetoresistive element as defined in claim 1 wherein said first and second ferromagnetic layers provide a cross point of 0.45 to 0.55.

3. A magnetoresistive element as defined in claim 1 wherein said magnetoresistive element has an element height of 0.1 to 1 μm.

4. A magnetoresistive element as defined in claim 1 further comprising a first cobalt layer between said first ferrromagnetic layer and non-magnetic layer and a second cobalt layer between said non-magnetic layer and second ferromagnetic layer.

5. A magnetoresistive element as defined in claim 1 wherein at least one of said first and second ferromagnetic layers contains as a main component thereof one of NiFe, NiFeCo, NiCo and Co.

6. A magnetoresistive element as defined in claim 1 wherein said non-magnetic layer contains as a main component thereof one of Cu, Ag added to Cu, and Re added Cu.

7. A magnetoresistive sensor comprising a substrate; a lower shield layer and a lower gap layer consecutively formed on said substrate and having a pattern; an active layer for med on said lower gap layer and including a magnetoresistive element and a longitudinal bias layer formed on an edge of said magnetoresistive element for providing a bias magnetic field to said magnetoresistive element; and an upper gap layer and an upper shield layer consecutively formed on said active layer, said magnetoresistive element including an antiferromagnetic layer, a first ferromagnetic layer, a non-magnetic layer and a second ferromagnetic layer of a soft magnetic material consecutively formed on said lower gap layer, said antiferromagnetic layer having a thickness of 5 to 30 nanometers and being made of a laminate including a nickel oxide film and a cobalt oxide film, said first and second ferromagnetic layers having a thickness of 1 to 10 nanometers.

8. A magnetoresistive sensor as defined in claim 7 wherein said first and second ferromagnetic layers provide a cross point of 0.45 to 0.55.

9. A magnetoresistive sensor as defined in claim 7 wherein said magnetoresistive element has an element height of 0.1 to 1 μm.

10. A magnetoresistive sensor as defined in claim 7 further including a first cobalt layer between said first ferromagnetic layer and non-magnetic layer and a second cobalt layer between said non-magnetic layer and second ferromagnetic layer.

11. A magnetoresistive sensor as defined in claim 7 wherein at least one of said first and second ferromagnetic layers contains as a main component thereof one of NiFe, NiFeCo, NiCo and Co.

12. A magnetoresistive sensor as defined in claim 7 wherein said non-magnetic layer contains as a main component thereof one of Cu, Ag added to Cu, and Re added to Cu.

* * * * *

UNITED STATES PATENT AND TRADEMARK OFFICE
CERTIFICATE OF CORRECTION

PATENT NO. : 5,889,640
DATED : March 30, 1999
INVENTOR(S) : Hayashi et al

It is certified that error appears in the above-identified patent and that said Letters Patent is hereby corrected as shown below:

Claim 6, Col. 10, line 10, insert - -to- -after "added"

Claim 7, Col. 10, line 14, "for med" should be - -formed- -.

Signed and Sealed this

Thirtieth Day of November, 1999

Attest:

Attesting Officer

Q. TODD DICKINSON

Acting Commissioner of Patents and Trademarks